United States Patent [19]

Inouye

[11] Patent Number: 4,620,154

[45] Date of Patent: Oct. 28, 1986

[54] IMAGING METHOD AND APPARATUS FOR OBTAINING SPIN-LATTICE RELAXATION TIME IMAGE UTILIZING NUCLEAR MAGNETIC RESONANCE

[75] Inventor: Tamon Inouye, Kawasaki, Japan

[73] Assignee: Kabushiki Kaisha Toshiba, Kawasaki, Japan

[21] Appl. No.: 622,267

[22] Filed: Jun. 19, 1984

[30] Foreign Application Priority Data

Jul. 20, 1983 [JP] Japan ................. 58-130958

[51] Int. Cl.$^4$ ........................................... G01R 33/22
[52] U.S. Cl. ..................................... 324/309; 324/312
[58] Field of Search ............... 324/309, 312, 307

[56] References Cited

U.S. PATENT DOCUMENTS

| 4,115,730 | 9/1978 | Mansfield | 324/309 |
| 4,549,139 | 10/1985 | MacFall et al. | 324/312 |
| 4,549,140 | 10/1985 | MacFall | 324/312 |

OTHER PUBLICATIONS

Mansfield et al, "Biological and Medical Imaging by NMR", Journal of Magnetic Resonance, vol. 29, pp. 355-373, 1978.

Brunner et al, "Sensitivity and Performance Time in NMR Imaging", Journal of Magnetic Resonance, vol. 33, pp. 83-106, 1979.

Tropper, "Image Reconstruction for the NMR Echo-Planar Technique, and for a Proposed Adaptation to Allow Continuous Data Aquisition, Journal of Magnetic Resonance, vol. 42, pp. 193-202, 1981.

Experimental Results with a Whole Body NMR-CT Scanner Using a Resistive Magnet, T. Inouye et al., Reprint from Radiation Medicine, vol. 1, No. 1, Jan.-Mar. 1983.

T. Inouye and T. Araki, "A Method for $T_1$ Relaxation Time Computed Images," Society of Magnetic Resonance in Medicine, Second Annual Meeting, San Francisco, Aug. 1983.

Primary Examiner—Stewart J. Levy
Assistant Examiner—Kevin D. O'Shea
Attorney, Agent, or Firm—Finnegan, Henderson, Farabow, Garrett & Dunner

[57] ABSTRACT

A image is constructed from nuclear magnetic resonance image data which represent a characteristic of an object. Data are collected using the saturation-recovery method and the inversion-recovery method; a first and second image are produced from data from each method, respectively; and a third image is produced from the first and second image, depending only on a single relaxation time.

10 Claims, 14 Drawing Figures

IMAGING METHOD AND APPARATUS FOR OBTAINING SPIN-LATTICE RELAXATION TIME IMAGE UTILIZING NUCLEAR MAGNETIC RESONANCE

BACKGROUND OF THE INVENTION

This invention relates to an imaging method and apparatus using nuclear magnetic resonance (NMR) techniques, which provide a clear image from a distribution of relaxation time $T_1$ on a desired slice of a patient.

The NMR imaging method is an attractive medical diagnostic technique, having many superior characteristics including noninvasive measurement and the ability to obtain diagnostic information at the cell level. NMR signals, however, are extremely weak and have a low signal-to-noise ratio when compared with signals detected in other diagnostic apparatus, e.g., X-rays or ultrasonic waves.

In a conventional NMR imaging method, atomic nuclei of hydrogen are selected as the measured element and an image of a distribution of hydrogen atomic nuclei is reconstructed using techniques similar to an X-ray computerized tomography scanner. Since NMR signals include information on the density of hydrogen atomic nuclei and other physical parameters, in particular relaxation times $T_1$ and $T_2$, the image produced by NMR is greatly influenced by the combination of these parameters.

Since the experiment to measure relaxation time $T_1$ by R. V. Damadian (See, e.g., U.S. Pat. No. 3,789,832), there have been many publications providing information on using NMR for medical diagnoses. Many researchers have reported that the magnitude of relaxation time, especially $T_1$ (spin-lattice), is remarkably effective in diagnosing malignancy tumors or cancerous cells. If an image (hereinafter called a $T_1$ image) can be obtained which depends only on relaxation time $T_1$ by removing the influence of any other physical parameters, then that $T_1$ image will assist greatly in medical diagnoses.

At present, NMR signals are usually detected utilizing the following pulse sequences:

(a) saturation-recovery method (SRM); and
(b) inversion-recovery method (IRM). These are predetermined pulse sequences including selective excitation pulses (SEP or 90° pulses) and 180° pulses which will be described later.

The image derived from the SRM pulse sequence is hereinafter called an SRM image and the image derived from the IRM pulse sequence is hereinafter called an IRM image.

The signal intensity I of each pixel of these images is expressed approximately as follows:

$$\text{SRM: } I \alpha \rho (1-e^{-T_1/t_1})e^{-T_2/t_2} \quad (1)$$

$$\text{IRM: } I \alpha \rho (1-2e^{-t_0/T_1})e^{-t_3/T_2} \quad (2)$$

where, $\rho$ is a density of hydrogen atomic nuclei, $T_1$ is a spin-lattice relaxation time, and $T_2$ is a spin-spin relaxation time. In the SRM pulse sequence, $t_1$ and $t_2$ indicate the repetition time intervals for the selective excitation pulse and spin-echo interval, respectively. In IRM pulse sequence, $t_0$ and $t_3$ indicate a waiting time between the first 180° pulse and the selective excitation pulse and spin-echo interval, respectively. The spin-echo interval is a period from selective excitation pulse to echo-signal to be measured.

In a conventional diagnostic apparatus utilizing NMR techniques, an SRM image or IRM image is reconstructed from echo-signals and displayed directly for diagnostic purposes. Generally, there is a close correlation between relaxation time $T_1$ and relaxation time $T_2$, since tissue or cells having a large relaxation time $T_1$ usually have a large relaxation time $T_2$. Consequently, each magnitude of the exponential of the relaxation times $T_1$, $T_2$ in equations (1), (2) cancel each other. The SRM image or the IRM image, therefore, contains only weak information about $T_1$ and $T_2$ relaxation time.

Comparing the SRM image and IRM image, the IRM image contributes more to relaxation time $T_1$ than the SRM image. Each signal intensity of the IRM image, as is apparent from equation (2), changes from positive region to negative region, so that the IRM image ($\rho=0$, i.e., where there is no object) becomes weak. In order to overcome these drawbacks, an improved method in which a plurality of images are generated by changing measuring parameters and relaxation times $T_1$, $T_2$ are calculated by comparing the intensities of images, is proposed. However, these images also have drawbacks in that the signal-to-noise ratio degrades. Therefore, it is difficult to obtain the $T_1$ image which depends only on relaxation time $T_1$.

SUMMARY OF THE INVENTION

It is an object of the present invention to provide an imaging method and apparatus for obtaining an image depending on $T_1$ (spin-lattice) relaxation time utilizing nuclear magnetic resonance.

It is another object of the present invention to provide an imaging method and apparatus for generating a clear image relating to a distribution of $T_1$ (spin-lattice) relaxation time in the slice of a patient.

This invention utilizes both SRM and IRM pulse sequences. According to the present invention, the same number of spin-echo signals (first echo, second echo, ..., N-th echo) are detected under similar measurement conditions in each pulse sequence, wherein each echo-interval which is a period from selective excitation pulse (SEP) to n-th (n=1,2, ... ,N) echo is set to a common value $t_{2n}$ (n=1,2, ... ,N) in each pulse sequence. The spin-echo signals detected under the same measurement condition are accumulated in each pulse sequence. By executing an image reconstruction process using the accumulated signals, an SRM image and an IRM image are obtained.

An intensity $I_{SRM}$ of a pixel data in an SRM image and an intensity $I_{IRM}$ of a pixel data in an IRM image according to this invention are given as follows:

$$I_{SRM} \alpha (1-e^{-t_1/T_1})(e^{-t_{21}/T_2}+E^{-t_{22}/T_2}+\ldots +e^{-t_{2N}/T_2}) \quad (3)$$

$$I_{IRM} \alpha (1-2e^{-t_0/T_1})(e^{-t_{21}/T_2}+e^{-t_{22}/T_2}+\ldots +e^{-t_{2N}/T_2}) \quad (4)$$

Then, according to the invention, the image depending only on relaxation time $T_1$ is generated by calculating a ratio of corresponding pixel data. The $T_1$ image is then given by equations (3), (4) as follows:

$$R=(1-2e^{-t_0/T_1})/(1-e^{-t_1/T_1}) \quad (5)$$

As is clear from equation (5), the $T_1$ image according to the present invention depends only on relaxation time $T_1$ and is not influenced by physical parameters such as (spin-spin) relaxation time $T_2$.

To achieve the foregoing objects, and in accordance with the purposes of the invention as embodied and broadly described herein, a method for producing an image from nuclear magnetic resonance image data which represents a characteristic of an object is provided which comprises the steps of: (a) collecting a first data set from spin-echo signals using the saturation recovery method; (b) collecting a second data set from spin-echo signals using the inversion recovery method; (c) generating a first image from the first data set; (d) generating a second image from the second data set; (e) generating a third image from the first and second image.

DESCRIPTION OF THE PREFERRED EMBODIMENT

Figure 1:
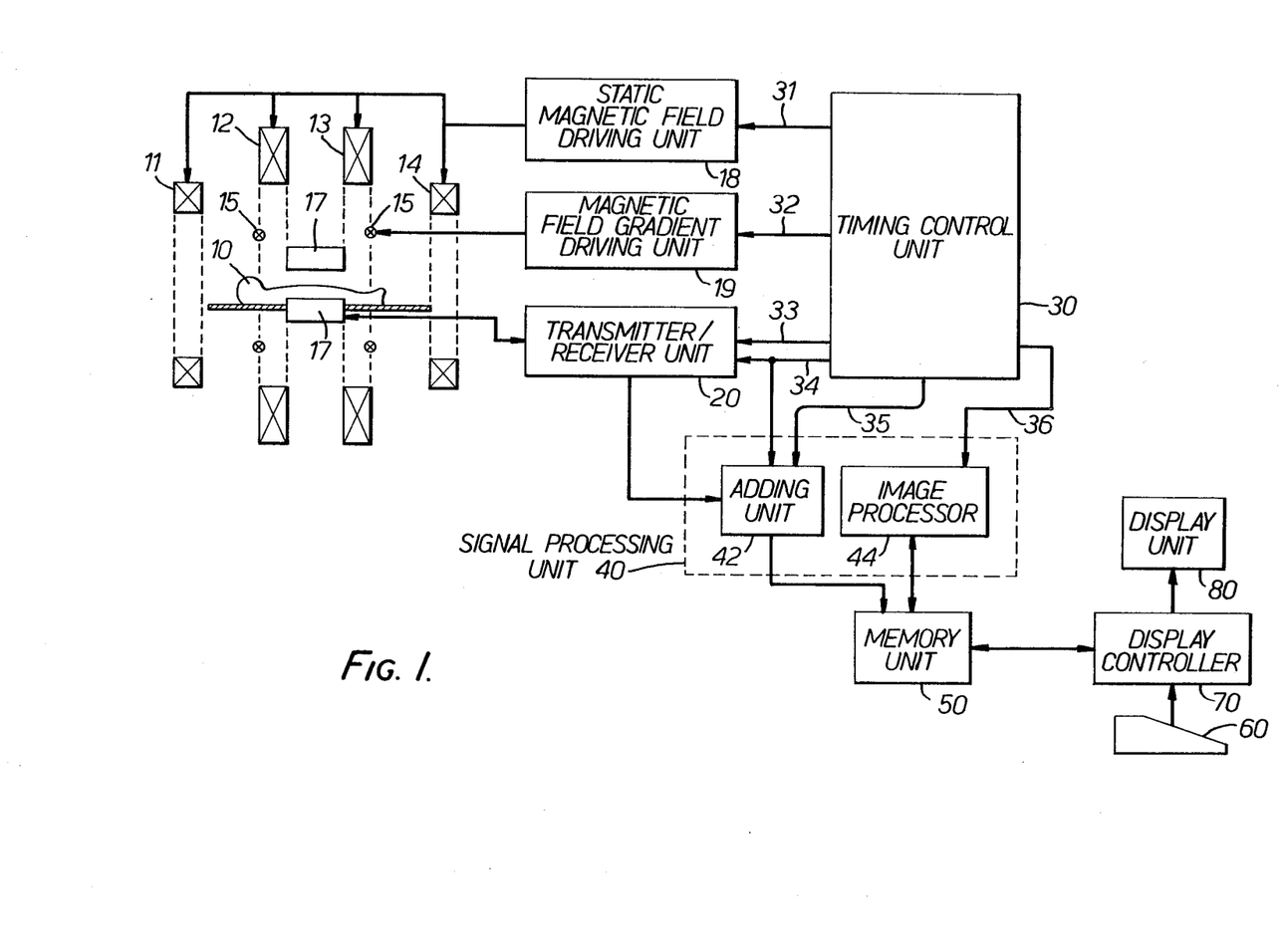
FIG. 1 shows a preferred embodiment of the present invention.

FIG. 1 shows an embodiment of the present invention. Four coils 11, 12, 13 and 14 are provided for generating a uniform static magnetic field $H_o$. The magnitude of the static magnetic field $H_o$ is, for example, 1500 Oe. An electromagnet 15 is provided in the inner space of coils 11, 12, 13 and 14 for generating magnetic field gradients. Electromagnet 15 which is shown in a simplified form in FIG. 1, comprises three coils, each generating a magnetic field gradient in a direction corresponding to the X-axis, Y-axis and Z-axis directions, respectively. By applying a certain combination of electric currents to the coils of the electromagnet 15, a magnetic field gradient can be generated and aligned in a selected direction. A probe head 17 is provided inside of the magnet 15 for generating a high frequency excitation pulse to induce nuclear magnetic resonance phenomenon and for detecting weak NMR signals. To obtain better sensitivity for detecting signals, probe head 17 is positioned as close as possible to a patient 10 and comprises a pair of saddle-shaped coils surrounding patient 10.

Static magnetic field driving unit 18 applies electric current to the coils 11, 12, 13 and 14. Magnetic field gradient driving unit 19 applies electric current to electromagnet 15. The magnitude of and the period for applying electric currents are controlled by a timing control unit 30. In general, the driving unit 18 continuously supplies a predetermined electric current in order to generate a static magnetic field $H_o$ throughout the measurement of NMR signals or spin-echo signals, while field driving unit 19 intermittently supplies electric currents having different magnitudes from each other in order to generate magnetic field gradients in a plurality of different directions.

Transmitter/receiver unit 20 supplies high frequency electric current to probe head 17 transmitting a selective excitation pulse (SEP) and thereby inducing nuclear magnetic resonance. Transmitter/receiver unit 20 receives NMR signals sensed by probe head 17, and amplifies, detects and converts the received NMR signals into digital signals. The high frequency electric current determines SRM pulse sequence or IRM pulse sequence consisting of selective excitation pulses and 180° pulses which will be hereinafter described in detail. The shape and applying interval of pulses are controlled by the timing control unit 30.

Figure 2:
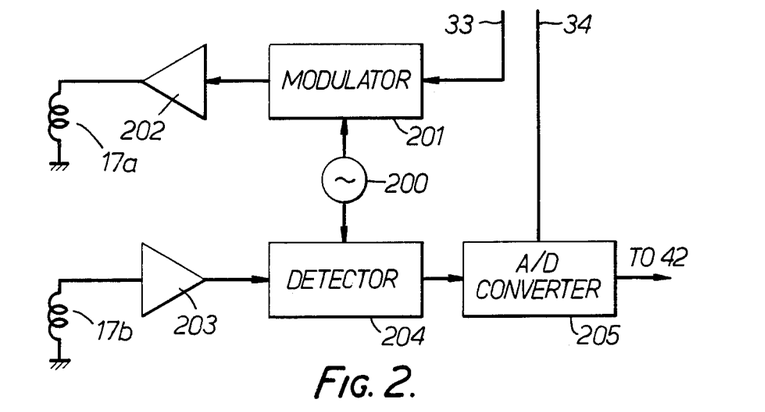
FIG. 2 shows an example of the transmitter-receiver unit 20 in FIG. 1.

FIG. 2 shows an example of the transmitter/receiver unit 20 in FIG. 1. A high frequency oscillator 200 provides a signal at a frequency which is equal to the resonance frequency (6.36 MHz) of hydrogen atomic nuclei responding to the static magnetic field $H_o$. This high frequency signal is modulated by a modulator 201 with the pulse sequence applied from the timing control unit 30, and amplified by a power amplifier 202. The output of power amplifier 202 is applied to probe head 17a. NMR signals sensed by the probe head 17b are amplified by an amplifier 203. A detector 204 detects the output of amplifier 203 using the output signal of high frequency oscillator 200 as a reference signal. An analog to digital converter 205 converts output signals of detector 204 into digital data during each sampling interval controlled by timing control unit 30. The digital data are sent to a signal processing unit 40.

Signal processing unit 40 in FIG. 1 includes an adding unit 42 and an image processor 44. Using either the SRM pulse sequence or the IRM pulse sequence, adding unit 42 adds or accumulates a plurality of digital data collected by transmitter/receiver unit 20 in order to improve the signal-to-noise ratio. Image processor 44 reconstructs an SRM image using accumulated data measured using the SRM pulse sequence and an IRM image using accumulated data measured using the IRM pulse sequence. Subsequently image processor 44 generates a pure $T_1$ image by dividing the corresponding pixel data of the SRM and IRM images. The $T_1$ image is stored in a memory unit 50, which may be a magnetic disk memory or floppy disk unit.

Images stored in memory unit 50 may be displayed for the purpose of diagnosis by a doctor. Responding to the key operation by an operator or a doctor, a console unit 60 outputs an image selection signal to a display controller 70. Display controller 70 retrieves the designated image from memory unit 50. The designated image is displayed on a display unit 80, wherein each pixel data is colored corresponding to its gray-shaded level. The SRM image or IRM image may be displayed on display unit 80 along with the $T_1$ image for comparison.

The saturation-recovery method (SRM) and inversion-recovery method (IRM) which are the imaging methods utilized by the present invention are briefly described. Their detailed description is shown, for example, in Inouye, NMR Imaging, Measurement and Control, vol. 21, No. 1, pp. 17–26, October 1982.

Figure 3:
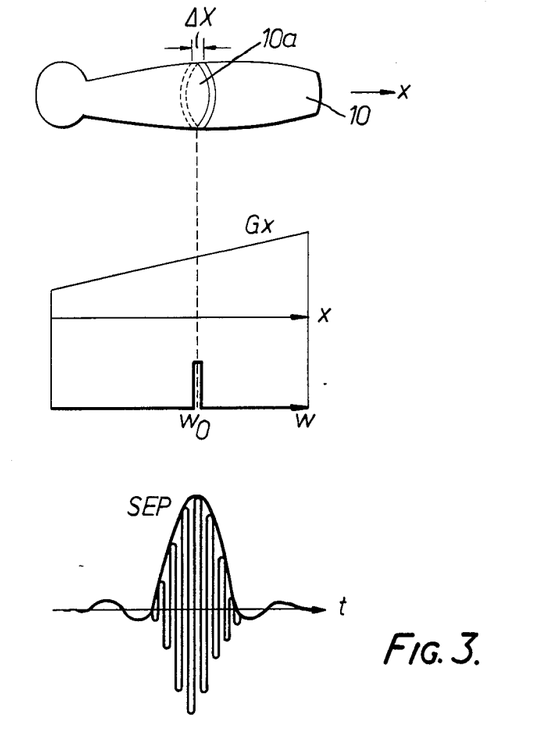
FIG. 3 shows wave forms of magnetic fields used for designating a slice of a patient.

Generally in NMR imaging, a cross sectional plane (hereinafter called a "slice") of a patient or an object is designated and then the image of a distribution of hydrogen nuclei contained in the tissue of the slice is reconstructed. In this embodiment, a selective excitation method is used for designating the slice of the patient, and a pure $T_1$ image shows a distribution of spin-lattice relaxation time in the slice of the patient. For example, as is shown in FIG. 3, a slice 10a of patient 10 is designated, slice 10a being perpendicular to the patient's longitudinal axis (X-axis) and having the width $\Delta x$.

According to the selective excitation method, nuclear spins only in slice 10a are excited selectively by applying a selective excitation pulse (SEP) with the magnetic field gradient being applied to the patient. Referring to FIG. 3, linear magnetic field gradient $G_x$ which is in an orthogonal direction to slice 10a is generated by electromagnet 15.

The SEP is a high frequency pulse which is applied from probe head 17 to slice 10a, its amplitude varying in proportion to the function $(\sin(\Delta\omega t/2))/t$, where Larmor frequency $\omega_o$ has a width $\Delta\omega = \gamma \cdot G_x \cdot \Delta x$ corresponding to the slice width $\Delta x$, and $\gamma$ is a nuclear magnetic rotational ratio constant which is determined by the atomic nuclei to be measured (hydrogen nuclei is used herein). The magnetization vector of the excited nuclei spin system in slice 10a is 90° inclined from non-excited nuclei spin system of the patient. After removing the SEP exciting pulse, the excited nuclei spin system exponentially recovers to the condition of thermal equilibrium; that is, the magnetizing vector of the excited nuclei in slice 10a gradually returns to the direction corresponding to the non-excited nuclei in the static magnetic field $H_o$. The relaxation times $T_1$, $T_2$ are the time constants representing this relaxation phenomenon.

Relaxation time $T_1$ is also called a spin-lattice relaxation time, and relaxation time $T_2$ is also called a spin-spin relaxation time. In this embodiment, the pure $T_1$ image which indicates the distribution of relaxation time $T_1$ of the tissue in slice 10a, is obtained by using a projection type reconstruction method.

Figure 4:
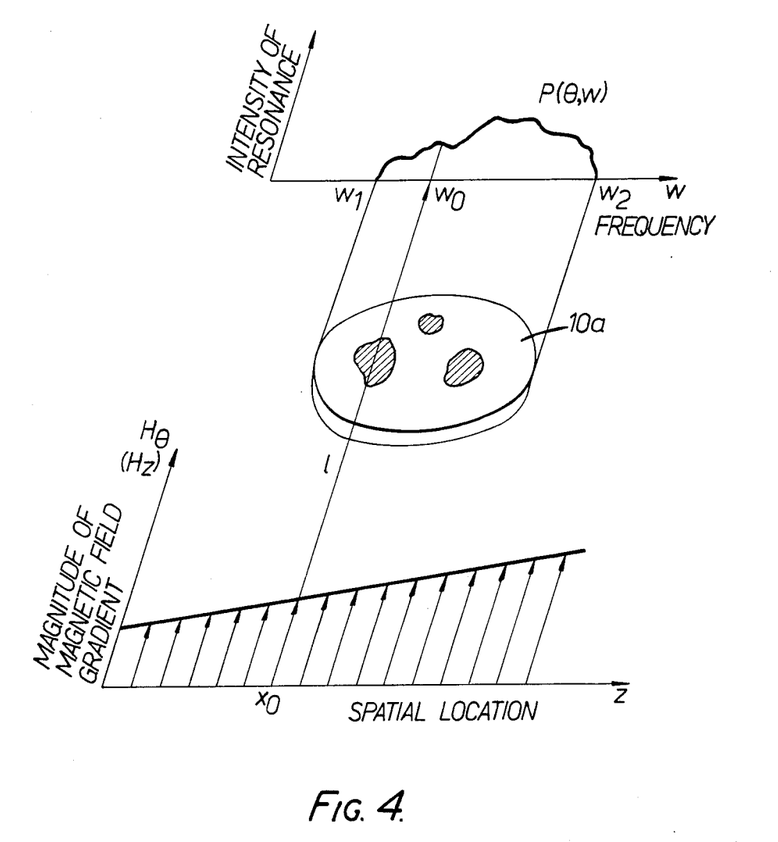
FIG. 4 is a schematic diagram showing an inclined static magnetic field and projection data.

Referring to FIG. 4, a linear magnetic field gradient $H_\theta$ is applied to slice 10a. The direction of the gradient is in the same plane in which slice 10a is included, i.e. y-z plane. Under this condition, the intensity of resonance signal corresponding to the Larmor frequency $\omega_o$ is the total integration of signals from the nuclear spins which exist along the equal magnitude line 1 of the magnetic field.

A projection function $P(\theta, \omega)$ of NMR signals, therefore, corresponds to the applied direction of linear magnetic field gradient $H_\theta$ by measuring resonant amplitude at a Larmor frequency (for example $\omega_1$ to $\omega_2$ in FIG. 4) corresponding to the value of the magnetic field to which the patient is subjected.

A plurality of projection functions (data) are obtained by changing the direction of the magnetic field gradient. From these projection functions a very accurate original image is reconstructed by an image reconstructing algorithm, for example, the filtered back projection method which is well-known and used in X-ray computerized tomography.

Such linear magnetic field gradient H is applied by electromagnet 15, which includes three coils each respectively generating a magnetic field in the X-axis, Y-axis or Z-axis. When slice 10a is in the Y-Z plane as is shown in FIG. 3, a linear magnetic field gradient at an arbitrary direction in the Y-Z plane is obtained by generating linear magnetic field gradients $H_y$ and $H_z$ corresponding to the Y-axis and Z-axis, and combining them in proportion to the directional cosine to each axis. The projection function is obtained by using SRM or IRM pulse sequences which will be described later.

Referring again to FIG. 1, the timing control unit 30 controls the timing of the static magnetic field, gradient magnetic field, and SEP pulse sequences (high frequency pulses). In this embodiment, timing control unit 30 comprises a microcomputer; therefore, the control is described using a flow chart shown in FIG. 5. Timers and pulse generators, however, also could be used to control the timing.

Figure 5:
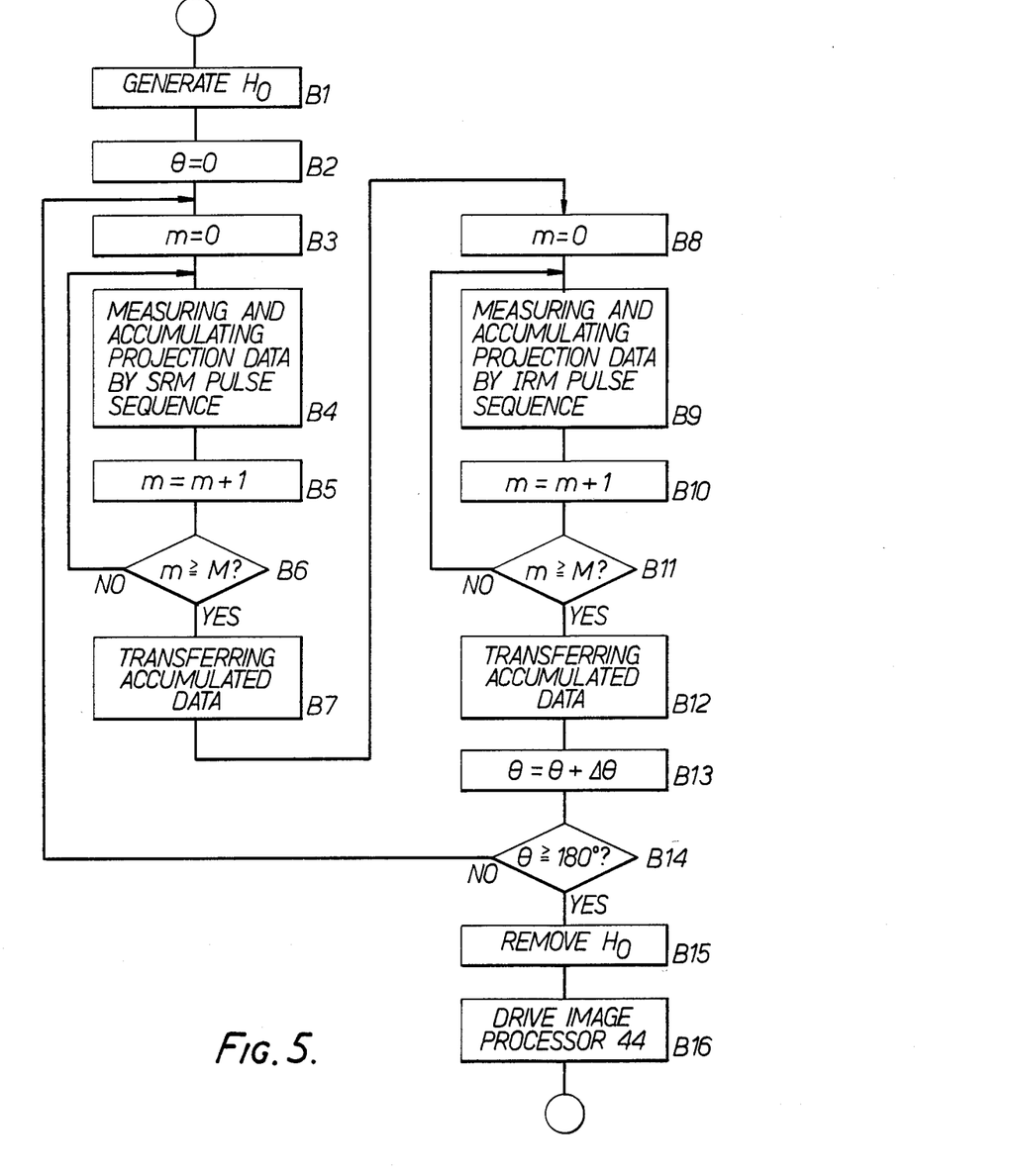
FIG. 5 is a flow chart showing the operations of timing controller 30 in FIG. 1.

FIG. 5 shows a flow chart for measuring NMR signals and for reconstructing the pure $T_1$ image. After precisely positioning the patient 10 inside the coils, timing control unit 30 initiates a control sequence responding to the operator's manual key operation or automatically detecting the position of the patient.

At step $B_1$, timing control unit 30 applies a control signal to the static magnetic field driving unit 18 through line 31. Responding to the control signal, driving unit 18 applies a current to coils 11–14 for generating the uniform static magnetic field $H_o$. At step $B_2$, timing control unit 30 clears an internal angular counter (not shown).

The contents of the angular counter indicate the angle $\theta$ corresponding to the direction of projection data (i.e., projection function) to be measured. Timing control unit 30 clears an internal loop counter (not shown) at step $B_3$. The loop counter is used for counting the repetition number (m) of SRM or IRM pulse sequences.

At step $B_4$, projection data are collected using the SRM pulse sequence. Such data are accumulated and processed, details of which will be described later with FIG. 6 and FIG. 8.

At step $B_5$, the content of loop counter is incremented by 1, and the constant of the loop counter is compared with the predetermined repetition number M. When the content (m) of the loop counter is less than M, step $B_4$ is repeated. After step $B_4$ is repeated M times, the accumulated data are transferred to memory 50. In successive steps $B_8$ through $B_{12}$, a similar process is conducted except that projection data are collected using an IRM pulse sequence and data are accumulated at step $B_9$, which will be described later with FIG. 7 and FIG. 8.

After measuring a plurality of projection data using both the SRM and IRM pulse sequences corresponding to the angle $\theta$, the content of the angular counter is added by a predetermined value at step $B_{13}$, then the content of the angular counter is compared with 180° at step $B_{14}$. When the angle $\theta$ is less than 180° the processing of step $B_3$ through $B_{12}$ is repeated. If the angle $\theta$ is greater than 180°, that is, there are sufficient projection data measured to reconstruct a pure $T_1$ image, then the static magnetic field $H_o$ is removed or stopped at step $B_{15}$. Timing control unit 30 subsequently sends a start pulse to image processing unit 44.

Figure 6:
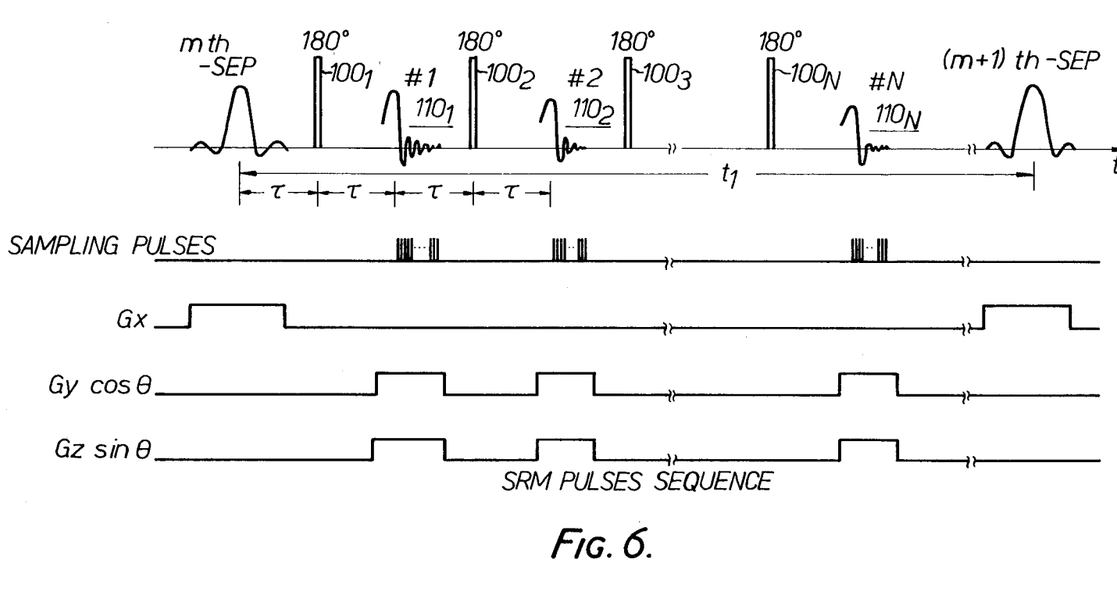
FIG. 6 shows an example of waveforms of an SRM pulse sequence to obtain an SRM image.

FIG. 6 shows an SRM pulse sequence for processing at step B₄ in FIG. 5. In the usual saturation-recovery method the SEP exciting pulse followed by 180° pulse is applied to slice 10a of patient 10 and the receiver detects a spin-echo signal from slice 10a. In this embodiment, N spin-echo signals are detected under the same measuring condition, so that N successive 180° pulses $100_1$, $100_2$, ..., $100_N$ are generated every interval $2\tau$. The SEP exciting pulse and the 180° pulses are controlled by timing control unit 30, which stores their waveform data in its internal memory (not shown), and supplies the waveform data to modulator 201 in transmitter/receiver unit 20 at a predetermined time.

Timing control unit 30 outputs a signal to driving unit 19 through a line 32 for generating a linear gradient magnetic field $G_x$ in order to designate slice 10a. At the same time, timing control unit 30 outputs an SEP exciting pulse to modulator 201, so that nuclear spins in designated slice 10a of patient 10 only are excited selectively and the magnetizing vector of the atomic nuclei is inclined 90° from the direction of the static magnetic field $H_o$.

After an interval $\tau$ from the SEP exciting pulse, timing control unit 30 applies a 180° pulse $100_1$ to modulator 201. The 180° pulse changes the direction of the magnetization vector of the spin of the atomic nuclei in slice 10a by 180°. Subsequently, the magnetization vector gradually changes its direction to the direction of static magnetic field $H_o$, thereby generating spin-echo signals. The spin-echo signals are collected as projection data. That is, timing control unit 30 applies sampling pulses to A/D converter 205 through line 34 after an interval $2\tau$ from the SEP exciting pulse. A/D converter 205 supplies a plurality of sampled digital data of spin-echo signal 110 to signal processing unit 40. At least through the sampling period, linear magnetic field gradient $H_o$ should be generated. Accordingly, driving unit 19, controlled by timing control unit 30, generates magnetic field $G_y\cos\theta$ in the X-axis direction and magnetic field $G_z\sin\theta$ in the Z-axis direction. Similarly, timing control unit 30 outputs (n−1) number of 180° pulses $100_2$, ..., $100_N$ to a line 33, after the first 180° pulse $100_2$, with an interval $2\tau$. Timing control unit 30 also outputs sampling pulses for measuring spin-echo signals $110_2$, ..., $110_N$, being detected with an interval $\tau$ from a corresponding 180° pulse.

A successive number N of spin-echo signals are sampled under the same magnetic field gradient $H_o$ condition in this embodiment, and this sequence is repeated M times as is shown in FIG. 5. Such sampled signals are accumulated by adding unit 42 and put in parallel with the above sampling.

Here, it is noted that the spin-echo signal $100_1$ is the largest signal among N number of them, in which the amplitude exponentially decreases at a time constant $T_2$. Therefore, interval $\tau$ is preferably selected as $\tau << T_2$ in this invention.

Figure 7:
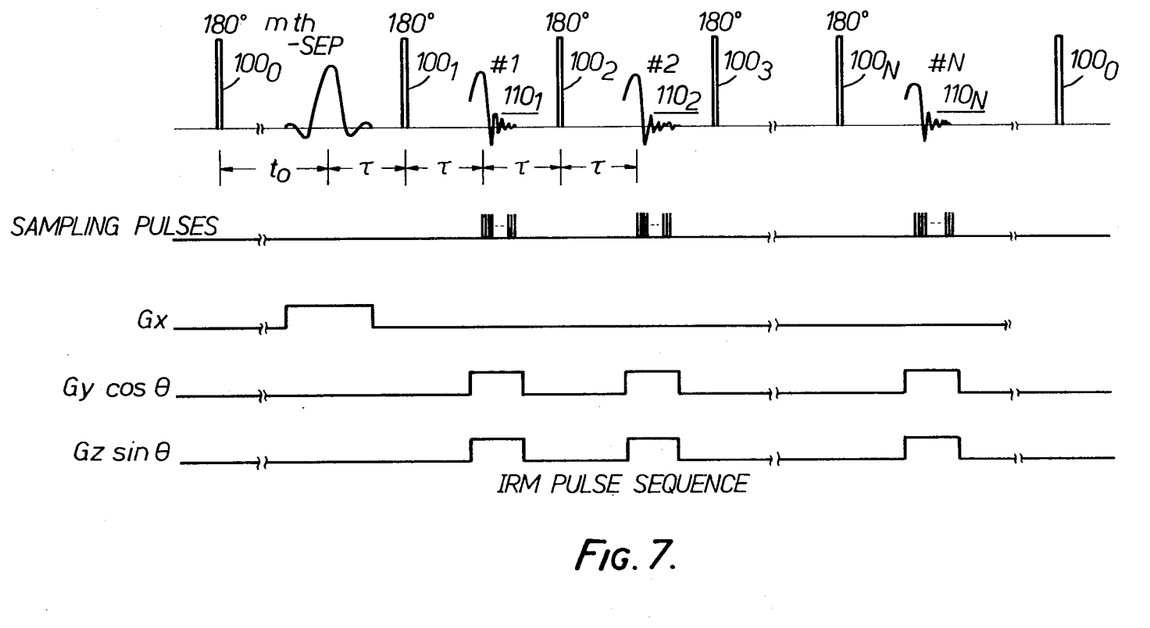
FIG. 7 shows an example of waveforms of an IRM pulse sequence to obtain an IRM image.

FIG. 7 shows an IRM pulse sequence for processing at step B₉ in FIG. 5. The IRM pulse sequence is similar to the SRM pulse sequence except that an additional 180° pulse is applied before the SEP exciting pulse. That is, in the IRM pulse sequence, a 180° pulse $100_0$ is applied initially and the SEP exciting pulse is applied a time duration $t_0$ later from 180° pulse $100_0$. Since succeeding pulses are exactly the same as with that of SRM, the description is omitted. However, measurements of echo-signals are repeated N×M times for every magnetic field gradient condition.

Figure 8:
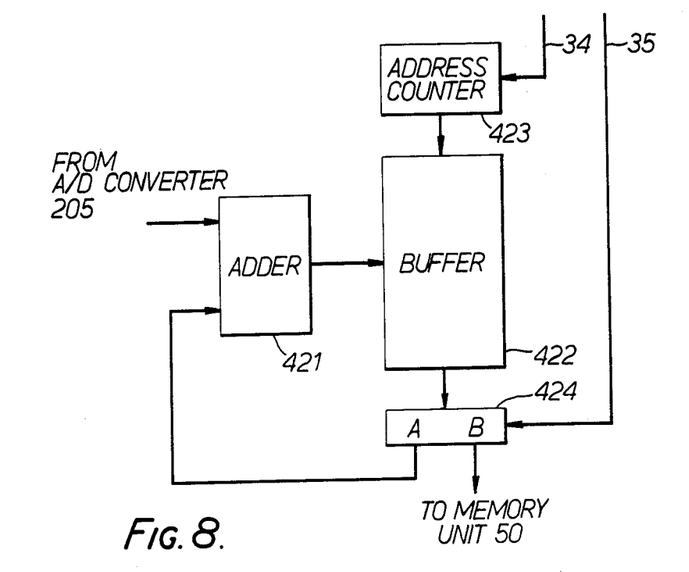
FIG. 8 shows an example of an adding unit 42 in FIG. 1.

FIG. 8 shows an example of adding unit 42 in signal processing unit 40. Adding unit 42 includes an adder 421, a data buffer 422 for temporarily storing accumulated data, an address counter 423 for addressing buffer 422 and a demultiplexer 424. Buffer 422 has sufficient memory space for storing all the digital data sampled from one spin-echo signal. Buffer 422 is cleared at the same time of steps B₃ and B₈ in FIG. 5.

When a sampling pulse is supplied from timing control unit 30, address counter 423 increments by 1, and stored data corresponding to the content of address counter 423 are read from buffer 422. The data read from buffer 422 are supplied to one input of adder 421 through demultiplexer 424 selecting output terminal A. At the other input terminal of adder 421, digital data sampled from the spin-echo signal are supplied from A/D converter 205 in transmitter/receiver unit 20. The output of adder 421 is written into the same address area of buffer 422 from which the stored data were read. Thus, data are accumulated in buffer 422 which were measured under the same magnetic field gradient H condition, after repeting step B₄ or B₉ M times.

Figure 9:
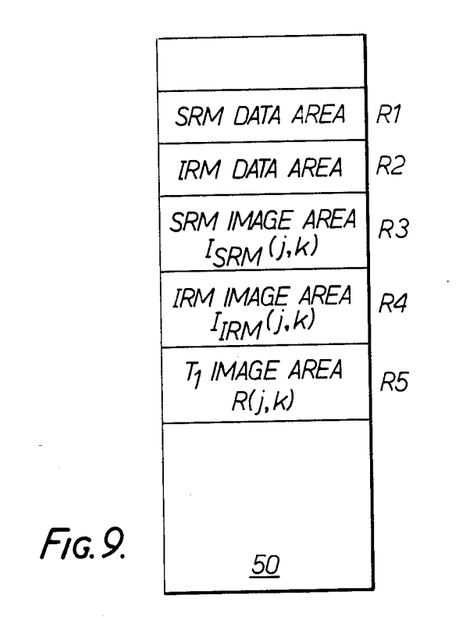
FIG. 9 shows a memory map of a memory unit 50 in FIG. 1.

At step B₇ or B₁₂, timing control unit 30 outputs a select signal to demultiplexer 424 selecting output terminal B. Then the accumulated data are read out and transferred to memory unit 50 by supplying sampling pulses through line 34 from timing control unit 30. During step B₇, the contents of buffer 422 are the accumulated data according to the SRM pulse sequence, which are stored in an SRM data area R1 of the memory unit 50 as shown in FIG. 9. During step B₁₂, the contents of buffer 422 are the accumulated data according to the IRM pulse sequence, which are stored in an IRM data area R2 of memory unit 50.

Figure 10:
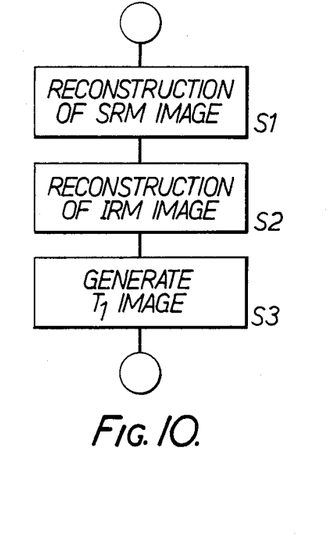
FIG. 10 is a general flow chart of an image processor 44 in FIG. 1.

FIG. 10 shows a whole flow chart of image processor 44. Image processor 44 reconstructs the SRM image from the data of area R1 in memory unit 50, and stores the SRM image in an SRM image area R3 of FIG. 9 at step S₁. Also, image processor 44 reconstructs the IRM image from the data of area R2 in memory unit 50 of FIG. 9, and stores the IRM image in an IRM image area R4 of memory unit 50 of FIG. 9 at step S₂.

The methods for reconstructing images at step S₁ and S₂ are the same as usually used in X-ray CT, for example, the filtered back projection method; therefore, a detailed description of that method is omitted. At step S₃, a pure $T_1$ image is produced from the data of areas R3 and R4, and it is stored in a $T_1$ image area R5 in the memory unit 50 of FIG. 9. A $T_1$ image is generated by dividing each pixel data of an IRM image by the corresponding pixel data of an SRM image according to the flow chart shown in FIG. 11.

Figure 11:
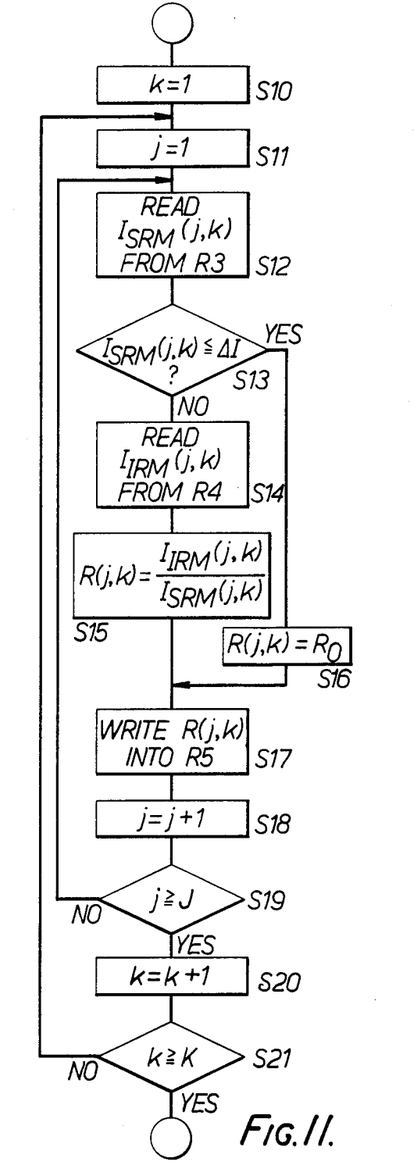
FIG. 11 shows detailed steps of the flow chart in FIG. 10.

In FIG. 11, each pixel data of the SRM image is indicated by $I_{SRM}(j,k)$, and each pixel data of the $T_1$ image is indicated by $R(j,k)$. Each image comprises $J \times K$ pixels. A k-counter (not shown) and a j-counter (not shown) are initialized at step $S_{10}$ and $S_{11}$. One pixel data $I_{SRM}(j,k)$ of SR image is read out from area R3 at step $S_{12}$, and is judged whether it is less than a fixed small value $\Delta I$ or not, at step $S_{13}$.

If $I_{SRM}(j,k) \leq \Delta I$ (i.e., the pixel data is in the background level of the image), then $R(j,k)$ is set to a predetermined value $R_0$ at step $S_{16}$. If $I_{SRM}(j,k) > \Delta I$, corresponding pixel data $I_{IRM}(j,k)$ of the IRM image is read out from area R4 at step $S_{14}$ and the data are divided at step $S_{15}$; that is, $R(j,k)$ is set equal to $I_{IRM}(j,k)/I_{SRM}(j,k)$. At step 17, $R(j,k)$ is written into the area R5. The j-counter is incremented by 1 at step $S_{18}$, and the content of j-counter is compared with J at step $S_{19}$. If $j<J$, then steps $S_{12}$ through $S_{18}$ are repeated. If $j \geq J$, then the k-counter is incremented by 1 at step $S_{20}$ and the content of the k-counter is compared with K. If $k<K$, then steps $S_{11}$ through $S_{20}$ are repeated. If $k \geq K$, then a pure $T_1$ image is produced in area R5. The process in FIG. 11 can be realized by using a divider and counters (or registers).

Figure 12:
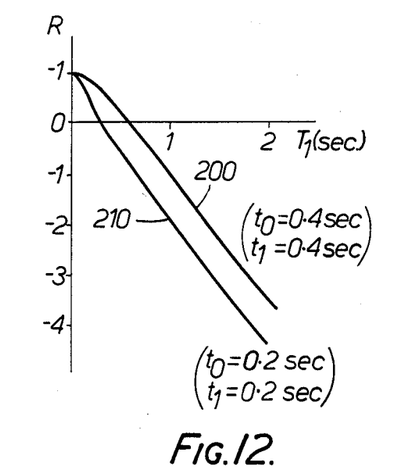
FIG. 12 shows the relation between a signal intensity R of $T_1$ image and relaxation time $T_1$.

According to the aforementioned embodiment of this invention, spin-echo intervals (the interval is the period from the SEP exciting pulse to spin-echo signal) are selected as 2 n (n=1,2,...,N), and such measurement is repeated M times. Therefore, intensities of pixel data in SRM image and IRM image are expressed as follows, instead of equations (3) and (4), $$I_{SRM} \alpha M \rho (1 - e^{-t_1/T_1}) \sum_{n=1}^{N} e^{-2n\tau/T_2} \quad (3)'$$

$$I_{IRM} \alpha M \rho (1 - 2e^{-t_0/T_1}) \sum_{n=1}^{N} e^{-2n\tau/T_2} \quad (4)'$$

where, $T_1$ is repetition rate of exciting pulse SEP in SRM pulse sequence, $t_o$ is a period from leading 180° pulse to exciting pulse SEP in IRM pulse sequence. Thus, the intensity of pixel data in pure $T_1$ image, according to this invention, is:

$$R(j,k) = \frac{1 - 2e^{-t_0/T_1}}{1 - e^{-t_1/T_1}} \quad (5)'$$

which depends only upon relaxation time $T_1$. Equation (5)' appears complicated, but R(j,k) monotonically decreases when $T_1$ increases when the condition $t_0 \leq t_1$ is satisfied. FIG. 12 shows the relation between $T_1$ and R, in which $t_0=0.4$ sec and $t_1=0.4$ sec are specified in curve 200, and $t_0=0.2$ sec and $t_1=0.4$ sec are specified in curve 210, respectively. It is noted that it is not necessary to select the condition at $t_0 \leq t_1$. Even if $t_0$ is slightly larger than $t_1$, monotonicity disappears only in the region where $T_1$ is near zero, resulting in no practical problem.

According to the above embodiment which utilizes a projection-type reconstruction method, a plurality of NMR signals, (i.e., spin-echo signals) sufficient for image reconstruction are obtained as sampled data. The data are located on a plurality of lines forming polar coordinates. Using the two-dimensional Fourier transform, such data are transformed and an image is reconstructed. On the other hand, data being expressed by orthogonal or rectangular coordinates also may be gathered by utilizing a two-dimensional Fourier transform imaging method. For this purpose, a modified magnetic field should be applied to slice 10a. For example, the direction of linear magnetic field gradient is fixed during the whole measurement but its applying period is varied for each spin-echo signal.

Figure 13:
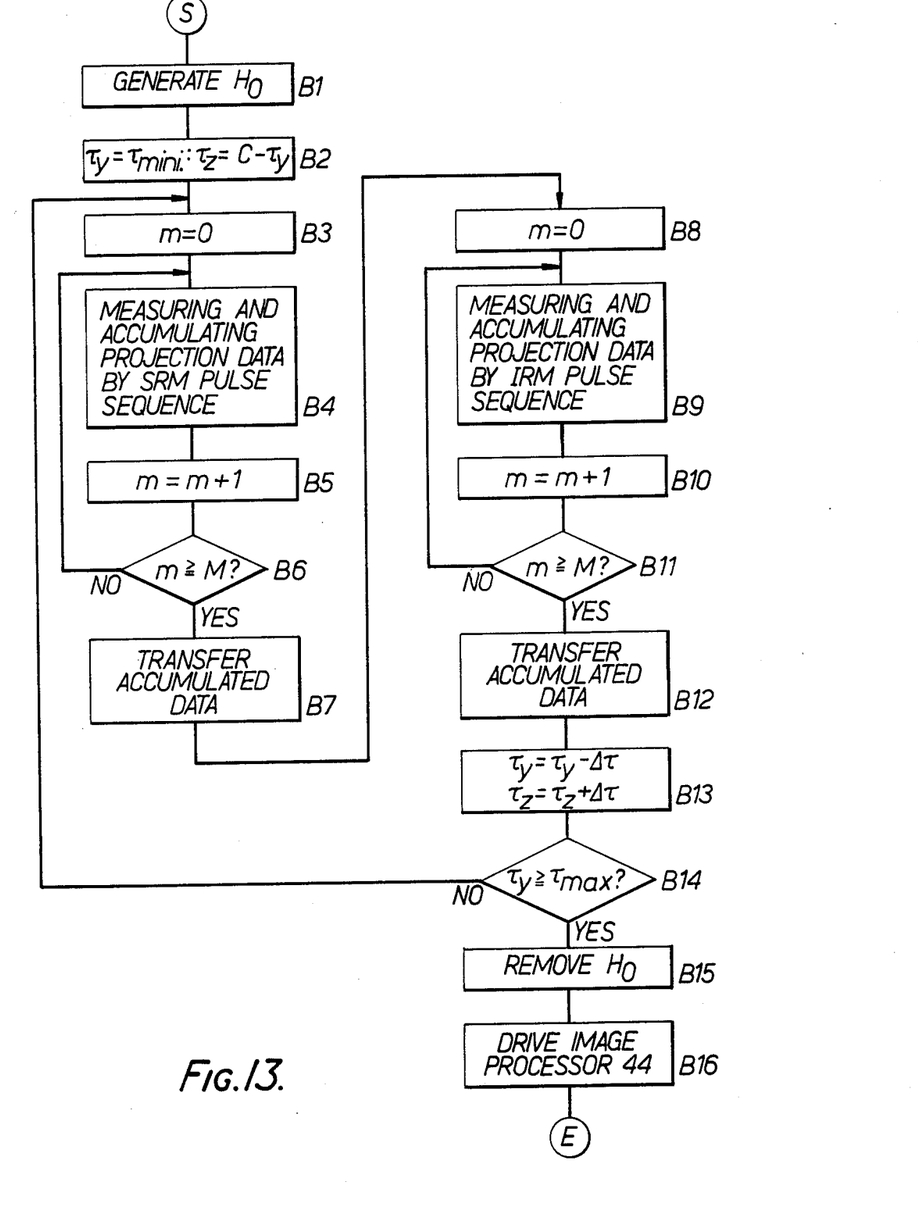
FIG. 13 is a flow chart showing the operations of timing controller 30 when using the two-dimensional Fourier transform method.

FIG. 13 shows a measuring flow chart for utilizing the two-dimensional Fourier transform imaging method as another embodiment of this invention. FIG. 13 differs only in steps $B_2$, $B_{13}$ and $B_{14}$ from FIG. 5. At step $B_2$, applying periods $\tau_y$, $\tau_z$ of linear magnetic field gradient $G_y$, $G_z$ are initialized, that is, $\tau_y = \tau_{mini}$ and $\tau_z = C - \tau_y$, where C is a constant value for keeping $\tau_y + \tau_z$ unchanged. At step $B_{13}$, period $\tau_y$ is increased by a fixed value $\Delta\tau$ and period $\tau_z$ is decreased by the fixed value $\Delta\tau$. Then $\tau_y$ is compared with an ending value $\tau_{max}$ at step $B_{14}$. Other steps in FIG. 13 are similar to those in FIG. 5, so the description is omitted.

Figure 14:
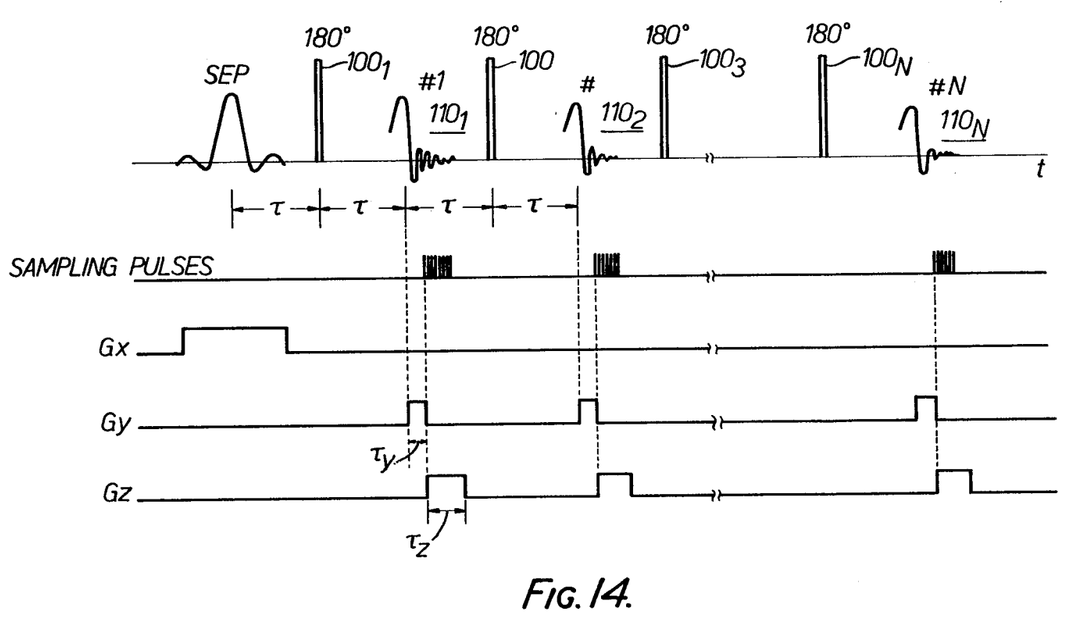
FIG. 14 shows another example of waveforms of an SRM pulse sequence to obtain an SRM image.

FIG. 14 shows the manner for applying the linear magnetic field gradients $G_y$, $G_z$ for the SRM pulse sequence. $G_y$ is applied to the slice for the period $\tau_y$, starting $2n\tau$ seconds later from the exciting pulse SEP corresponding to n-th spin-echo signal. $G_z$ is applied successively to the slice for the period $\tau_z$. Sampling pulses are supplied from the changing points of the magnetic field gradients. Other operations are the same as in FIG. 6, and also similar in case of IRM pulse sequence.

An SRM image or IRM image is obtained easily according to the two-dimensional Fourier transform method, by two-dimensional Fourier inverse-transforming the sampled data.

The other type of magnetic field gradient is also available for utilizing two-dimensional Fourier transform method, by changing the magnitude of the magnetic field gradient for each spin-signal with fixed periods of $G_y$, $G_z$ during the whole measurement.

In the above embodiments sampled data for the SRM image and the IRM image are obtained alternatively at each measurement condition. For example, all of the data for the SRM image is collected and, by changing the magnetic field gradient, all of the data for IRM image is collected, if the movement of the patient can be neglected during measurement. Collecting and storing data may be executed serially.

According to the above embodiments, M×N sampled data are collected. When M is large, then N should be 1. Only the first spin-echo signals ($110_1$), therefore, are sampled by applying M 180° pulses ($100_1$) for each magnetic field gradient condition.

Additional advantages and modifications will readily occur to those skilled in the art. The invention in its broader aspects is not, therefore, limited to the specific details, representative models, and illustrative examples shown and described. Accordingly, departures may be made from such details without departing from the spirit or scope of applicant's general inventive concept.

What is claimed is:

1. A method for producing an image of a slice of an object relating to a spin lattice relaxation time $T_1$ using a saturation-recovery method and an inversion-recovery method, comprising the steps of:
    a. collecting a first data set from spin-echo signals using said saturation-recovery method;
    b. collecting a second data set from spin-echo signals using said inversion-recovery method;
    c. generating a first image from said first data set;
    d. generating a second image from said second data set; and
    e. generating a third image from a ratio of said first and second images.

2. The method for producing an image of a slice of an object as recited in claim 1, wherein said step of generating a third image includes dividing pixel data of said second image by corresponding pixel data of said first image.

3. An apparatus for generating an image of a designated slice of an object using a saturation recovery method and an inversion recovery method of nuclear magnetic resonance, comprising:
    a. means for generating a uniform static magnetic field and applying said static magnetic field to said object;
    b. means for generating a magnetic field gradient with said uniform static magnetic field thereby defining a slice of said object orthogonal to said field gradient for a particular resonance frequency;

c. means for generating first and second pulse sequences in accordance with said saturation-recovery method and said inversion-recovery method respectively, wherein each pulse sequence includes a selective excitation pulse (SEP) and a 180° pulse;

d. means for generating an alternating magnetic field wherein said alternating magnetic field passes through said designated slice of said object and said alternating magnetic field is applied with said first and second pulse sequences generated by said first and second pulse sequence generating means;

e. means for detecting spin-echo signals from said object after a predetermined spin-echo interval from said 180° pulse of said first and second pulse sequences;

f. means for reconstructing first and second images of said designated slice from said spin-echo signals corresponding to said saturation-recovery method and inversion-recovery method respectively; and g. means for generating a third image from said first and second images, whereby said first, second and third image each include pixel data, and said third image pixel data represents a distribution of relaxation time $T_1$ on said designated slice, being a ratio of pixel data of said first image and corresponding pixel data of said second image.

4. A nuclear magnetic resonance image display device comprising:

a. means for generating a saturation-recovery pulse sequence and an inversion-recovery pulse sequence;

b. means for inducing nuclear magnetic resonance to atomic nuclei in a slice of an object;

c. means for detecting first NMR signals induced by said saturation-recovery pulse sequence and second NMR signals induced by said inversion-recovery pulse sequence;

d. means for reconstructing a saturation-recovery image and an inversion-recovery image from said first and second NMR signals, respectively, each image representing physical characteristics of the atomic nuclei in said slice of the object;

e. means for controlling said saturation-recovery and inversion-recovery pulse generating means, said inducing means, said detecting means and said reconstructing means;

f. means for generating a relaxation time $T_1$ image from said saturation-recovery image and said inversion-recovery image, said relaxation time $T_1$ image representing a distribution of relaxation time $T_1$ of said atomic nuclei in said slice of said object and each pixel data of said relaxation time $T_1$ image being obtained as a ratio between pixel data of said inversion-recovery image and corresponding pixel data of said saturation-recovery image;

g. means for storing said saturation-recovery image, inversion-recovery image, and relaxation time $T_1$ image; and h. means for displaying at least one of said images stored in said storing means.

5. An image display device according to claim 4 wherein:

a. said saturation-recovery pulse sequence and said inversion-recovery pulse sequence include a selective excitation pulse (SEP) and a plurality of 180° pulses; and b. said detecting means includes means for detecting spin-echo signals as said first and second NMR signals, said spin-echo signals being sampled after a common spin-echo interval from each 180° pulse.

6. An image display device according to claim 5 further comprising means for accumulating spin-echo signals, said accumulating means being coupled to said detecting means and said reconstructing means.

7. An image display device according to claim 4, wherein said inducing means further includes:

a. first means for generating a uniform static magnetic field through said object;

b. second means for generating a magnetic field gradient wherein said magnetic field gradient designates by nuclear magnetic resonance said slice of the object; and c. third means for generating an alternating magnetic field in accordance with said saturation-recovery pulse sequence and said inversion-recovery pulse sequence.

8. An image display device according to claim 7 wherein said second generating means includes three coils, each generating respectively orthogonal magnetic field gradients.

9. An image display device according to claim 5, wherein said inducing means further includes:

a. first means for generating a uniform static magnetic field through said object;

b. second means for generating a magnetic field gradient wherein said magnetic field gradient designates by nuclear magnetic resonance said slice of the object; and c. third means for generating an alternating magnetic field in accordance with said saturation-recovery pulse sequence and said inversion-recovery pulse sequence.

10. An image display device according to claim 9, wherein said second generating means includes three coils, each generating respectively orthogonal magnetic field gradients.

* * * * *